United States Patent
Ohno

(10) Patent No.: US 9,224,645 B2
(45) Date of Patent: Dec. 29, 2015

(54) SILICON CARBIDE SEMICONDUCTOR DEVICE AND METHOD FOR MANUFACTURING THE SAME

(75) Inventor: Jun-ichi Ohno, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 10 days.

(21) Appl. No.: 13/980,998

(22) PCT Filed: Sep. 9, 2011

(86) PCT No.: PCT/JP2011/070591
§ 371 (c)(1),
(2), (4) Date: Jul. 22, 2013

(87) PCT Pub. No.: WO2012/140795
PCT Pub. Date: Oct. 18, 2012

(65) Prior Publication Data
US 2013/0306992 A1    Nov. 21, 2013

(30) Foreign Application Priority Data
Apr. 11, 2011 (JP) ................. 2011-086984

(51) Int. Cl.
| H01L 21/768 | (2006.01) |
| H01L 23/482 | (2006.01) |
| H01L 21/04 | (2006.01) |
| H01L 29/45 | (2006.01) |
| H01L 29/66 | (2006.01) |
| H01L 29/872 | (2006.01) |

(Continued)

(52) U.S. Cl.
CPC ...... *H01L 21/76889* (2013.01); *H01L 21/0485* (2013.01); *H01L 21/0495* (2013.01); *H01L 21/3065* (2013.01); *H01L 23/4827* (2013.01); *H01L 29/45* (2013.01); *H01L 29/6606* (2013.01); *H01L 29/66143* (2013.01); *H01L 29/872* (2013.01); *H01L 29/1608* (2013.01); *H01L 29/8611* (2013.01); *H01L 2924/0002* (2013.01)

(58) Field of Classification Search
IPC .................. H01L 2924/0002,2924/00
See application file for complete search history.

(56) References Cited

U.S. PATENT DOCUMENTS 6,051,283 A * 4/2000 Lee et al. ............ 427/553
6,207,565 B1   3/2001 Yeh et al.
(Continued)

FOREIGN PATENT DOCUMENTS

| EP | 0403936 A2 | 12/1990 |
| JP | 2003243323 A | 8/2003 |

(Continued)

OTHER PUBLICATIONS

International Search Report issued in PCT/JP2011/070591, dated Nov. 22, 2011.

*Primary Examiner* — Latanya N Crawford
(74) *Attorney, Agent, or Firm* — Hauptman Ham, LLP

(57) ABSTRACT

A silicon carbide semiconductor device includes: a silicon carbide layer, a reaction layer which is in contact with the silicon carbide layer, a conductive oxidation layer which is in contact with the reaction layer, and an electrode layer which is formed over the reaction layer with the conductive oxidation layer interposed therebetween. A thickness of the conductive oxidation layer falls within a range of 0.3 nm to 2.25 nm.

15 Claims, 9 Drawing Sheets

(51) Int. Cl.
*H01L 21/3065* (2006.01)
*H01L 29/16* (2006.01)
*H01L 29/861* (2006.01)

(56) References Cited

U.S. PATENT DOCUMENTS

| | | | |
|---|---|---|---|
| 8,445,352 B2 * | 5/2013 | Yokoyama et al. | 438/309 |
| 2005/0012113 A1 * | 1/2005 | Sheu et al. | 257/184 |
| 2006/0205195 A1 | 9/2006 | Malhan et al. | |
| 2007/0138482 A1 * | 6/2007 | Tanimoto | 257/77 |
| 2009/0045414 A1 | 2/2009 | Kawada et al. | |
| 2012/0161098 A1 * | 6/2012 | Hiura et al. | 257/9 |
| 2013/0244428 A1 * | 9/2013 | Ohno | 438/689 |

FOREIGN PATENT DOCUMENTS

| | | |
|---|---|---|
| JP | 2006024880 A | 1/2006 |
| JP | 2006261624 A | 9/2006 |
| JP | 2008053291 A | 3/2008 |
| JP | 2009-49130 A | 3/2009 |
| JP | 2010205824 A | 9/2010 |

* cited by examiner

SILICON CARBIDE SEMICONDUCTOR DEVICE AND METHOD FOR MANUFACTURING THE SAME

RELATED APPLICATIONS

The present application is a National Phase of PCT/JP2011/070591, filed Sep. 9, 2011, and is based on, and claims priority from, Japanese Application No. 2011-086984, filed Apr. 11, 2011.

TECHNICAL FIELD

The present invention relates to a silicon carbide semiconductor device and a method for manufacturing the silicon carbide semiconductor device.

BACKGROUND ART

A silicon carbide semiconductor device is a semiconductor device which includes a silicon carbide layer, and has excellent technical features such as a high breakdown voltage, low loss, a low leakage current, high-temperature operability, and high-speed operability. Accordingly, the application of the silicon carbide semiconductor device to a power element such as a switching element or a rectifying element has been highly anticipated. As the power element, although a power MOSFET, an IGBT, a Schottky diode, a pn diode, a thyristor or the like has been known, all these power elements have an ohmic electrode which is in contact with a silicon carbide layer so that, in many cases, an electric current of several amperes flows between the silicon carbide layer and the ohmic electrode.

Conventionally, as a method for manufacturing a silicon carbide semiconductor device, there has been known a method described in patent literature 1 (a conventional method for manufacturing a silicon carbide semiconductor device). FIG. 10 is a view for explaining the conventional method for manufacturing a silicon carbide semiconductor device. FIG. 10(a) to FIG. 10(e) are views showing respective steps.

The conventional method for manufacturing a silicon carbide semiconductor device sequentially includes, as shown in FIG. 10, a conductive layer forming step where a conductive layer 922 made of nickel is formed on a silicon carbide layer 910 (see FIG. 10(a)), a heat treatment step where the silicon carbide layer 910 and the conductive layer 922 are made to react with each other thus forming an alloy layer formed of a reaction layer 920 which is in contact with the silicon carbide layer 910 and a silicide layer 924 present on the reaction layer 920 (see FIG. 10(b) and FIG. 10(c)), an etching step where at least a portion of the silicide layer 924 is removed using an acid thus exposing at least a portion of a surface of the reaction layer 920 (see FIG. 10(d)), and an electrode layer forming step where one electrode layer 940 and the other electrode layers 942 are formed on the exposed surface of the reaction layer 920 (see FIG. 10(e)) in this order.

According to the conventional method for manufacturing a silicon carbide semiconductor device, the alloy layer formed of the reaction layer 920 and the silicide layer 924 is formed on the surface of the silicon carbide layer 910 and, thereafter, the surface of the reaction layer 920 is exposed, and the electrode layer 940 and another electrode layer 942 are formed on the exposed surface of the reaction layer 920. Accordingly, not only the electrode layer 940 and the silicon carbide layer 910 are favorably bonded to each other with the reaction layer 920 interposed therebetween but also it is possible to eliminate a possibility that a carbon component in the silicon carbide layer 910 diffuses into the electrode layer 940. As a result, the concentration of carbon in the surface of the electrode layer 940 can be lowered and hence, the adhesiveness between the electrode layer 940 and the other electrode layer 942 formed on the electrode layer 940 can be improved. Accordingly, it is possible to provide a highly reliable silicon carbide semiconductor device 900 where a possibility that the delamination of an electrode can be suppressed while ensuring a favorable contact between the silicon carbide layer and the electrode layer.

PRIOR ART LITERATURE

Patent Literature

Patent Literature 1: JP-A-2006-24880

SUMMARY OF THE INVENTION

Technical Problem

In the technical field to which semiconductor devices pertain, including a silicon carbide semiconductor device, there has been a demand for the further reduction of contact resistance between a semiconductor base body and an electrode layer.

In view of the above, the present invention has been made to overcome the above-mentioned drawbacks, and it is an object of the present invention to provide a silicon carbide semiconductor device which can realize the further reduction of contact resistance between a semiconductor base body and an electrode layer, and a method for manufacturing the silicon carbide semiconductor device.

Solution to Problem

According to studies made by the inventors of the present invention, the inventors of the present invention have found that, by forming an electrode layer over a reaction layer with a predetermined conductive oxidation layer interposed therebetween instead of directly forming the electrode layer on the reaction layer, contact resistance between the semiconductor base body and the electrode layer can be further reduced. The present invention has been completed based on such finding. That is, the present invention is constituted of the following technical features.

[1] According to one aspect of the present invention, there is provided a silicon carbide semiconductor device which includes: a silicon carbide layer; a reaction layer and a conductive oxidation layer which is in contact with the reaction layer, the reaction layer and the conductive oxidation layer being formed by executing the steps in the following order: a conductive layer forming step where a conductive layer is formed on the silicon carbide layer; a heat treatment step where the silicon carbide layer and the conductive layer are made to react with each other thus forming the reaction layer which is in contact with the silicon carbide layer and a silicide layer which is present on the reaction layer; a first plasma ashing step where a carbon component which the silicide layer contains is removed; an etching step where at least a portion of the silicide layer is removed using an acid thus exposing at least a portion of a surface of the reaction layer; and a second plasma asking step where a carbon component which remains on the reaction layer is removed and a conductive oxidation layer is formed on the reaction layer, and an electrode layer which is formed over the reaction layer with the conductive oxidation layer interposed therebetween.

[2] In the silicon carbide semiconductor device of the present invention, it is preferable that a thickness of the conductive oxidation layer falls within a range of 0.3 nm to 2.25 nm.

[3] In the silicon carbide semiconductor device of the present invention, it is preferable that the acids are a hydrochloric acid, a nitric acid and a hydrofluoric acid.

[4] According to another aspect of the present invention, there is provided a method for manufacturing a silicon carbide semiconductor device for manufacturing the silicon carbide semiconductor device of the present invention which includes the steps in the following order: a conductive layer forming step where a conductive layer is formed on the silicon carbide layer; a heat treatment step where the silicon carbide layer and the conductive layer are made to react with each other thus forming a reaction layer which is in contact with the silicon carbide layer and a silicide layer which is present on the reaction layer; a first plasma ashing step where a carbon component which the silicide layer contains is removed; an etching step where at least a portion of the silicide layer is removed using an acid thus exposing at least a portion of a surface of the reaction layer; a second plasma ashing step where a carbon component which remains on the reaction layer is removed and a conductive oxidation layer which is in contact with the reaction layer is formed on the reaction layer; and an electrode layer forming step where an electrode layer is formed over the exposed reaction layer with the conductive oxidation layer interposed therebetween.

[5] In the method for manufacturing a silicon carbide semiconductor device of the present invention, it is preferable that a thickness of the conductive oxidation layer falls within a range of 0.3 nm to 2.25 nm.

[6] In the method for manufacturing a silicon carbide semiconductor device of the present invention, it is preferable that an oxidation layer which includes the conductive oxidation layer is formed on the reaction layer in the second plasma ashing step, and the method further comprises a second etching step where the oxidation layer formed in the second plasma ashing step is made thin so as to expose the conductive oxidation layer between the second plasma ashing step and the electrode layer forming step.

[7] In the method for manufacturing a silicon carbide semiconductor device of the present invention, it is preferable that an oxidation layer which includes the conductive oxidation layer is formed on the reaction layer in the second plasma ashing step, and the method further comprises a cleaning step where the oxidation layer formed in the second plasma ashing step is made thin so as to expose the conductive oxidation layer between the second plasma ashing step and the electrode layer forming step.

[8] In the method for manufacturing a silicon carbide semiconductor device of the present invention, it is preferable that an oxidation layer which is constituted of only the conductive oxidation layer is formed over the reaction layer in the second plasma ashing step.

[9] In the method for manufacturing a silicon carbide semiconductor device of the present invention, it is preferable that the second plasma ashing step is carried out using any one of an oxygen gas and a mixed gas of an oxygen gas and a hydrogen gas.

[10] In the method for manufacturing a silicon carbide semiconductor device of the present invention, it is preferable that the etching step is carried out using a hydrochloric acid, a nitric acid and a hydrofluoric acid.

[11] In the method for manufacturing a silicon carbide semiconductor device of the present invention, it is preferable that the etching step is carried out using an etchant which contains a hydrochloric acid, a nitric acid and a hydrofluoric acid.

[12] In the method for manufacturing a silicon carbide semiconductor device of the present invention, it is preferable that a content ratio among the hydrochloric acid, the nitric acid and the hydrofluoric acid which the etchant contains is set such that, assuming the content of the nitric acid as 100 mol, the content of the hydrochloric acid falls within a range of 300 mol to 500 mol, and the content of the hydrofluoric acid falls within a range of 0.1 mol to 5 mol.

[13] In the method for manufacturing a silicon carbide semiconductor device of the present invention, it is preferable that the etching step includes an etching step where an etchant A containing a hydrochloric acid is used and an etching step where an etchant B containing a nitric acid and a hydrofluoric acid is used.

[14] In the method for manufacturing a silicon carbide semiconductor device of the present invention, it is preferable that the content ratio between the nitric acid and the hydrofluoric acid which the etchant B contains is set such that, assuming the content of the nitric acid as 100 mol, the content of the hydrofluoric acid falls within a range of 0.1 mol to 5 mol.

[15] In the method for manufacturing a silicon carbide semiconductor device of the present invention, it is preferable that the first plasma asking step is carried out using any one of an oxygen gas, a hydrogen gas and a mixed gas of an oxygen gas and a hydrogen gas.

Advantageous effects of Invention

According to the silicon carbide semiconductor device of the present invention, by forming an electrode layer over the reaction layer with the predetermined conductive oxidation layer interposed therebetween instead of forming the electrode layer directly on the reaction layer, contact resistance between the semiconductor base body (silicon carbide layer) and the electrode layer can be further reduced as can be understood from examples described later.

Figure 1:
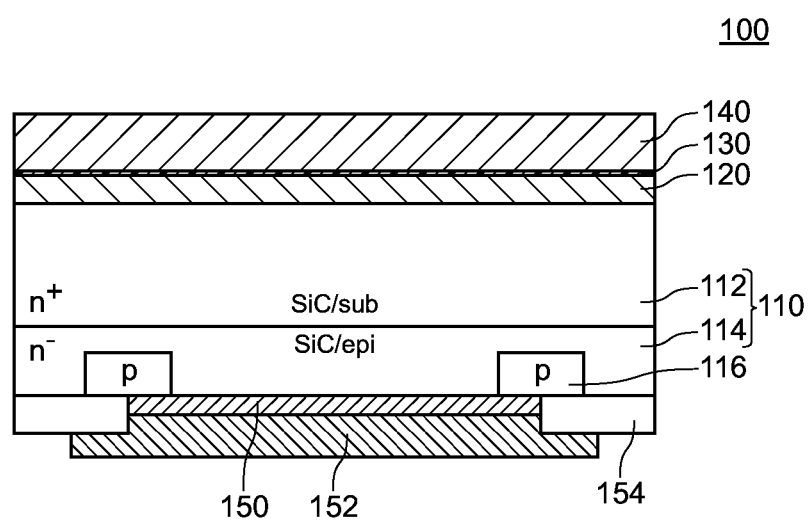
FIG. 1
A cross-sectional view of a silicon carbide semiconductor device 100 according to an embodiment 1.

A cross-sectional view of a silicon carbide semiconductor device 108 according to an embodiment 5.

FIG. 8

A view for explaining an evaluation system 10 in examples.

FIG. 9

A graph showing a result of evaluation in the examples.

FIG. 10

A view for explaining a conventional method for manufacturing a silicon carbide semiconductor device.

DESCRIPTION OF EMBODIMENTS

Hereinafter, a silicon carbide semiconductor device and a method for manufacturing the silicon carbide semiconductor device of the present invention are explained in conjunction with embodiments shown in the drawings.

Embodiment 1

FIG. 1 is a cross-sectional view of a silicon carbide semiconductor device 100 according to an embodiment 1.

As shown in FIG. 1, the silicon carbide semiconductor device 100 is a Schottky diode which includes: a silicon carbide layer 110; a reaction layer 120, a conductive oxidation layer 130 formed adjacent to the reaction layer 120 and a cathode electrode layer 140 (an electrode layer of the present invention) formed adjacent to the conductive oxidation layer 130, all of which are formed on a first main surface side of the silicon carbide layer 100; and a barrier metal layer 150, an anode electrode layer 152 and a protective insulation layer 154 which are formed on a second main surface side of the silicon carbide layer 100.

The silicon carbide layer 110 includes an $n^+$ type silicon carbide substrate 112 and an $n^-$ type epitaxial layer 114 containing n-type impurities at a concentration lower than a concentration of n-type impurities contained in the $n^+$ type silicon carbide substrate 112. A thickness of the $n^+$ type silicon carbide substrate 112 is 300 μm, for example, and the concentration of n-type impurities in the $n^+$ type silicon carbide substrate 112 is $1\times10^{19}$ cm$^{-3}$, for example. A thickness of the $n^-$ type epitaxial layer 114 is 10 μm, for example, and the concentration of n-type impurities in the $n^-$ type epitaxial layer 114 is $1\times10^{16}$ cm$^{-3}$, for example.

A p-type guard ring 116 is formed on a surface of the $n^-$ type epitaxial layer 114 on a second main surface side. A concentration of p-type impurities in the guard ring 116 falls within a range of $1\times10^{18}$ cm$^{-3}$ to $1\times10^{19}$ cm$^{-3}$, for example.

The reaction layer 120 is a layer which is formed by the diffusion of a nickel component into the $n^+$ type silicon carbide substrate 112. A concentration of nickel in the reaction layer 120 falls within a range of $1.0\times10^3$ cm$^{-3}$ to $1.0\times10^4$ cm$^{-3}$, for example, and the concentration of nickel is gradually lowered along with the increase of a distance from a bonding surface between the reaction layer 120 and the conductive oxidation layer 130. A thickness of the reaction layer 120 falls within a range of 10 nm to 200 nm, for example.

The conductive oxidation layer 130 is a conductive oxidation layer which is formed on the reaction layer 120 in a contact manner with the reaction layer 120, and is formed by carrying out a second plasma asking step for removing a carbon component which may remain on the reaction layer 120. A thickness of the conductive oxidation layer 130 falls within a range of 0.3 nm to 2.25 nm, for example.

The cathode electrode layer 140 is formed by depositing metal (nickel, for example) which is a cathode electrode forming material over the reaction layer 120 by vapor deposition with the conductive oxidation layer 130 interposed therebetween. A thickness of the cathode electrode layer 140 is 2 μm, for example.

The barrier metal layer 150 is made of metal (nickel, titanium or the like, for example) which forms a Schottky junction with the silicon carbide layer 110 ($n^-$ type epitaxial layer 114). A thickness of the barrier metal layer 150 is 2 μm, for example. The anode electrode layer 152 is formed on a surface of the barrier metal layer 150. A thickness of the anode electrode layer 152 is 5 μm, for example. The anode electrode layer 152 is made of aluminum, for example. The protective insulation layer 154 is formed such that the protective insulation layer 154 surrounds the barrier metal layer 150 and the anode electrode layer 152.

The silicon carbide semiconductor device 100 having the above-mentioned constitution can be manufactured by the following method (the method for manufacturing the silicon carbide semiconductor device according to the embodiment 1). Hereinafter, the method for manufacturing the silicon carbide semiconductor device according to the embodiment 1 is explained in accordance with manufacturing steps.

FIG. 2 and FIG. 3 are views for explaining the method for manufacturing a silicon carbide semiconductor device according to the embodiment 1. FIG. 2(a) to FIG. 2(e) and FIG. 3(a) to FIG. 3(e) are views showing respective steps.

1. Silicon Carbide Layer Preparing Step

Figure 2A:
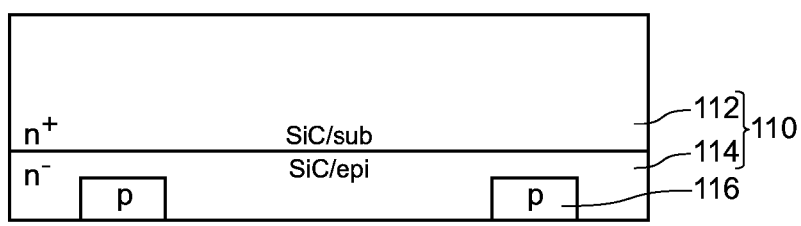
FIG. 2
A view for explaining a method for manufacturing a silicon carbide semiconductor device according to the embodiment 1.

Firstly, the silicon carbide layer 110 having the structure where the $n^+$ type silicon carbide substrate 112 and the $n^-$ type epitaxial layer 114 are laminated to each other is prepared (see FIG. 2(a)). The p-type guard ring 116 is formed on the surface of the $n^-$ type epitaxial layer 114.

2. Conductive Layer Forming Step

Figure 2B:
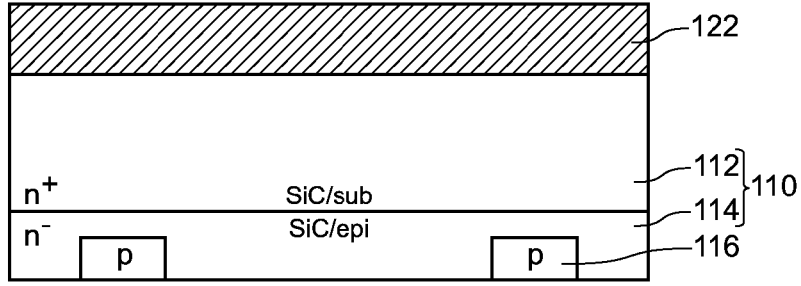

Next, a conductive layer 122 made of nickel is formed on a surface of the silicon carbide layer 110 ($n^+$ type silicon carbide substrate 112) on a first main surface side by EB vapor deposition, for example (see FIG. 2(b)). A thickness of the conductive layer 122 is set to 50 nm to 500 nm, for example. As a material for forming the conductive layer 122, a metal material (aluminum, titanium, cobalt or the like) other than nickel may be used.

3. Heat Treatment Step

Next, heat treatment is performed such that the silicon carbide layer 110 ($n^+$ type silicon carbide substrate 112) and the conductive layer 122 are made to react with each other thus forming an alloy layer formed of the reaction layer 120 which is in contact with the silicon carbide layer 110 ($n^+$ type silicon carbide substrate 112) and a silicide layer 124 which is present on the reaction layer 120. Heat treatment is performed at a temperature of 1000° C. for 2 minutes in an inert atmosphere of highly purified argon (Ar) or the like from which moisture and oxygen are removed.

Figure 2C:
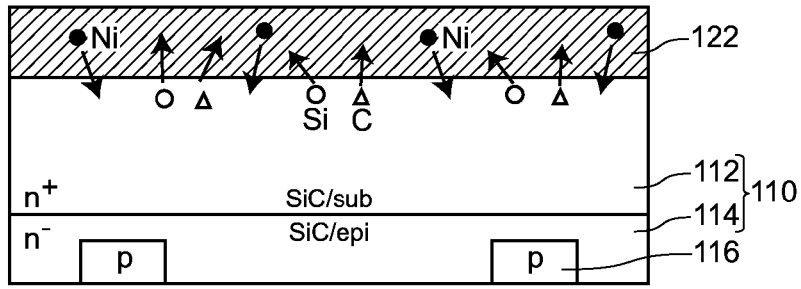
Figure 2D:
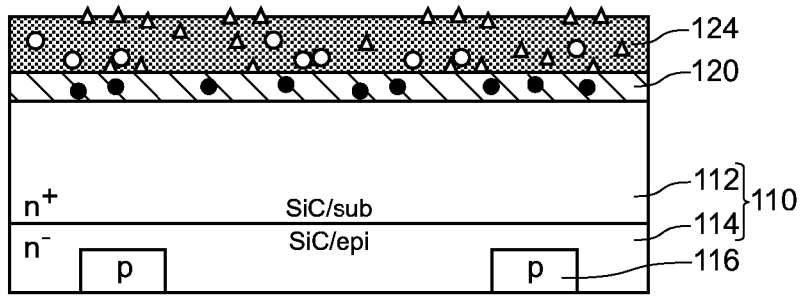

Due to such processing, the nickel component contained in the conductive layer 122 diffuses into the $n^+$ type silicon carbide substrate 112 thus forming the reaction layer 120, and a silicon component and a carbon component contained in the $n^+$ type silicon carbide substrate 112 diffuse into the conductive layer 122 thus forming the silicide layer 124 (see FIG. 2(c) and FIG. 2(d)).

4. First Plasma Ashing Step

Figure 2E:
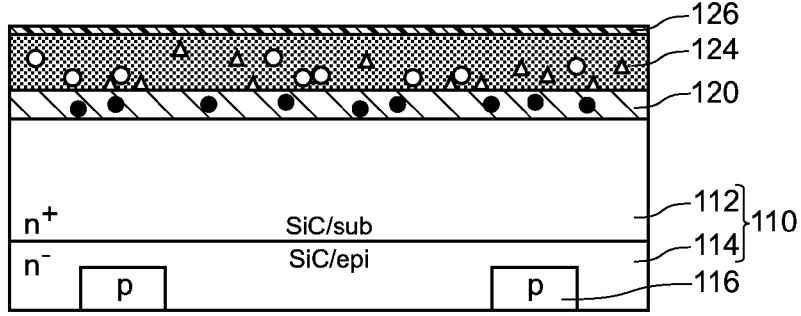

Next, the carbon component contained in the silicide layer 124 is removed by first plasma ashing (see FIG. 2(e)). The first plasma ashing is carried out using an oxygen gas (ashing condition: output power 1000 W, ashing time 5 min). By carrying out the first plasma ashing step, the carbon component in the vicinity of a surface of the silicide layer 124 is removed and hence, an etching step described later can be efficiently carried out. In this step, by carrying out the first plasma ashing step, a nickel oxide layer 126 is formed on the surface of the silicide layer 124.

5. Etching Step

Figure 3A:
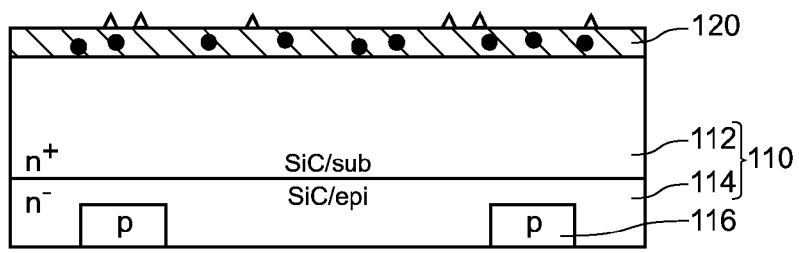
FIG. 3
A view for explaining the method for manufacturing a silicon carbide semiconductor device according to the embodiment 1.
Figure 3B:
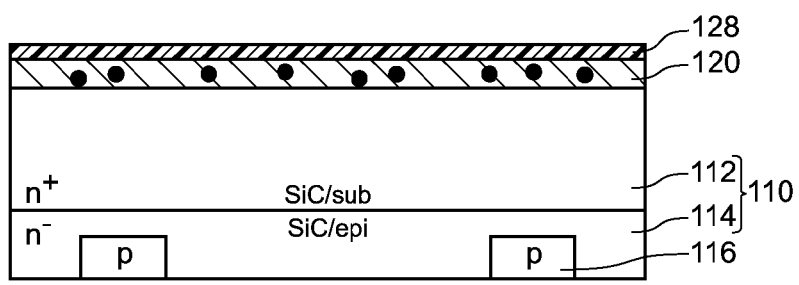

Next, a surface of the reaction layer 120 is exposed by removing the silicide layer 124 using an etchant containing a hydrochloric acid, a nitric acid and a hydrofluoric acid (etchant) (see FIG. 3(a)).

In the etching step, the nickel component is removed from the silicide layer 124 by a hydrochloric acid, and the silicon component is removed from the silicide layer 124 by a nitric acid and a hydrofluoric acid. Also in the etching step, the nickel oxide layer 126 which is formed in the first plasma ashing step is also removed. The content ratio among the hydrochloric acid, the nitric acid and the hydrofluoric acid which the etchant contains is set such that, assuming the content of the nitric acid as 100 mol, the content of the hydrochloric acid falls within a range of 300 mol to 500 mol, and the content of the hydrofluoric acid falls within a range of 0.1 mol to 5 mol.

6. Second Plasma Ashing Step

Next, the carbon component on the surface of the reaction layer 120 is removed by second plasma ashing. The second plasma ashing is carried out using an oxygen gas. By carrying out the second plasma ashing, the carbon component can be removed from the surface of the reaction layer 120. The second plasma ashing step is carried out under an ashing condition (output power 500 W, ashing time 5 min) where a thickness of an oxidation layer 128 becomes 10 nm, for example. In the second plasma ashing step, the oxidation layer 128 including "a conductive oxidation layer which is in contact with the reaction layer 120" is formed on the reaction layer 120 (see FIG. 3(b)).

7. Second Etching Step

Figure 3C:
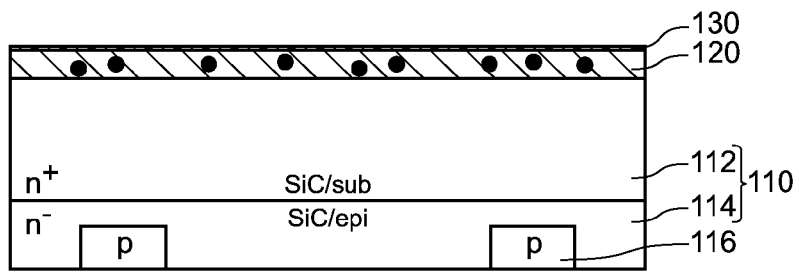

Next, the oxidation layer 128 which is formed by the second plasma asking step is made thin using an etchant containing a hydrofluoric acid thus exposing a conductive oxidation layer 130 (see FIG. 3(c)). The second etching step is carried out under a condition where a thickness of the conductive oxidation layer 130 falls within a range of 0.3 nm to 2.25 nm.

8. Cathode Electrode Layer Forming Step

Figure 3D:
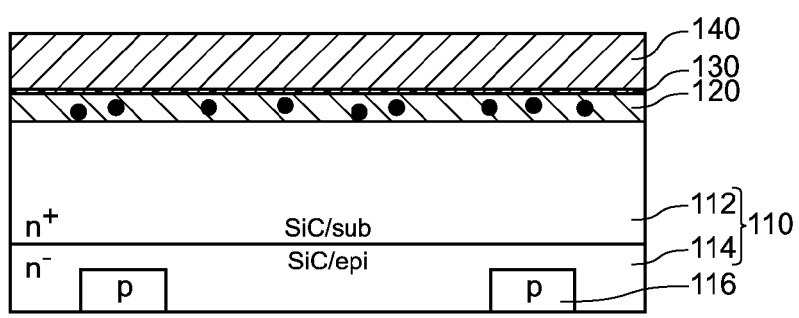

Next, the cathode electrode layer 140 made of nickel is formed over the reaction layer 120 with the conductive oxidation layer 130 interposed therebetween (on a surface of the conductive oxidation layer 130) by physical vapor deposition (PVD) such as sputtering, for example (see FIG. 3(d)).

Figure 3E:
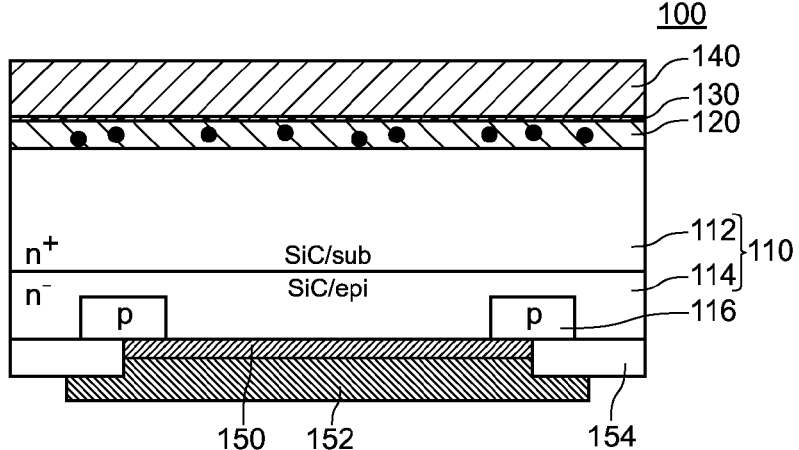

Next, the protective insulation layer 154, the barrier metal layer 150 and the anode electrode layer 152 are formed on the surface of the n⁻ type epitaxial layer 114 (see FIG. 3(e)).

By sequentially carrying out the above-mentioned steps, the silicon carbide semiconductor device 100 can be manufactured.

According to the silicon carbide semiconductor device and the method for manufacturing the silicon carbide semiconductor device of the embodiment 1, the electrode layer is formed over the reaction layer with the predetermined conductive oxidation layer interposed therebetween instead of forming the electrode layer directly on the reaction layer. Accordingly, contact resistance between the semiconductor base body (silicon carbide layer) and the electrode layer can be further reduced as can be understood from examples described later.

Further, according to the silicon carbide semiconductor device and the method for manufacturing the silicon carbide semiconductor device of the embodiment 1, the thickness of the conductive oxidation layer falls within a range of 0.3 nm to 2.25 nm. Accordingly, contact resistance between the semiconductor base body (silicon carbide layer) and the electrode layer can be further reduced as can be understood from examples described later.

However, according to studies that the inventors of the present invention have made, it is understood that, in the conventional method for manufacturing a silicon carbide semiconductor device, a nickel component in the silicide layer is selectively etched in the above-mentioned etching step so that a silicon component tends to remain on the reaction layer thus giving rise to a drawback that dispersion in device characteristics occurs.

There has been known a method for manufacturing a silicon carbide semiconductor device including a step where a silicide layer is removed by a CMP process in place of an etching process (another conventional method for manufacturing a silicon carbide semiconductor device, see JP-A-2009-10096, for example). According to this conventional method for manufacturing a silicon carbide semiconductor device, the silicide layer is removed by the CMP process and hence, there is no possibility that a silicon component remains on a reaction layer whereby it is possible to overcome a drawback that dispersion in device characteristics occurs. However, in this conventional method for manufacturing a silicon carbide semiconductor device, the silicide layer is removed by the CMP process and hence, there exists a drawback that productivity of the silicon carbide semiconductor devices is low.

To the contrary, according to the method for manufacturing a silicon carbide semiconductor device of the embodiment 1, the etching step is carried out using a hydrochloric acid, a nitric acid and a hydrofluoric acid and hence, both components, that is, a nickel component and a silicon component can be removed by the etching step. Accordingly, it is possible to overcome a drawback that dispersion in device characteristics occurs due to a silicon component remaining after an etching step.

Further, according to the method for manufacturing a silicon carbide semiconductor device of the embodiment 1, the silicide layer is removed by an etching process instead of a CMP process and hence, silicon carbide semiconductor devices can be manufactured with higher productivity than other conventional methods for manufacturing a silicon carbide semiconductor device.

Accordingly, the method for manufacturing a silicon carbide semiconductor device according to the embodiment 1 can overcome a drawback that dispersion in device characteristics occurs due to a silicon component remaining after an etching step, and also can manufacture silicon carbide semiconductor devices with high productivity.

Embodiment 2

FIG. 4 is a view for explaining a method for manufacturing a silicon carbide semiconductor device according to an embodiment 2. FIG. 4(a) to FIG. 4(e) are views showing respective steps. The method for manufacturing a silicon carbide semiconductor device according to the embodiment 2 includes the steps which exactly correspond to the steps of the method for manufacturing a silicon carbide semiconductor device according to the embodiment 1 shown in FIG. 2(a) to FIG. 2(e) respectively. Accordingly, the illustration of the steps of the method for manufacturing a silicon carbide semiconductor device according to the embodiment 2 corresponding to the steps shown in FIG. 2(a) to FIG. 2(e) is omitted.

Although the method for manufacturing a silicon carbide semiconductor device according to the embodiment 2 basically includes the substantially same steps as the method for manufacturing a silicon carbide semiconductor device 100 according to the embodiment 1, the method for manufacturing a silicon carbide semiconductor device according to the embodiment 2 differs from the method for manufacturing a silicon carbide semiconductor device according to the embodiment 1 with respect to the details of the second plasma ashing step. That is, in the method for manufacturing a silicon carbide semiconductor device according to the embodiment 2, the second plasma ashing step is carried out under an ashing condition (output power 200 W, ashing time 3 min) which is weaker than the ashing condition used in the method for manufacturing a silicon carbide semiconductor device according to the embodiment 1. Further, by adopting such a second plasma ashing step, the second etching step is omitted. After the second plasma ashing step is carried out, the silicon carbide semiconductor device is cleaned using a cleaning liquid containing a diluted hydrofluoric acid and, then, the electrode forming step is carried out.

Figure 4A:
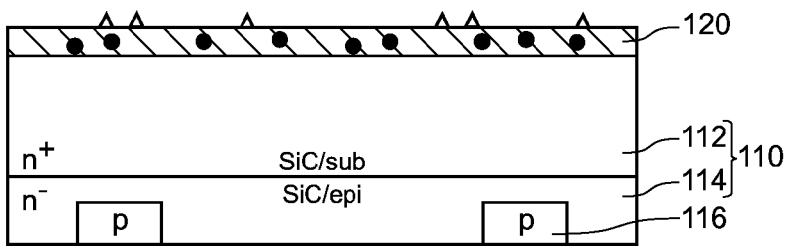
FIG. 4
A view for explaining a method for manufacturing a silicon carbide semiconductor device according to an embodiment 2.
Figure 4B:
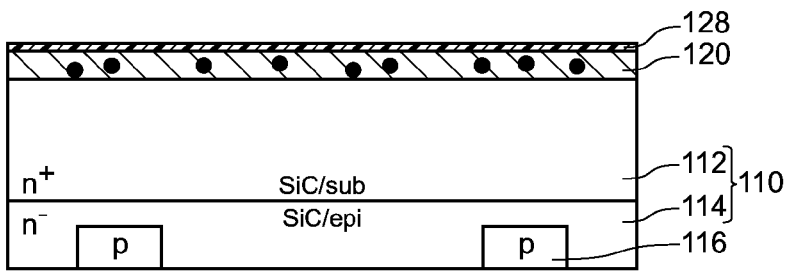
Figure 4C:
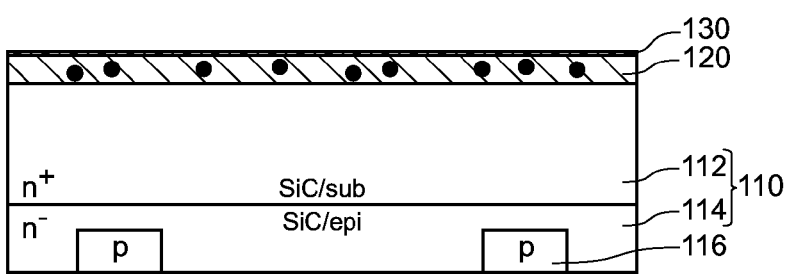
Figure 4D:
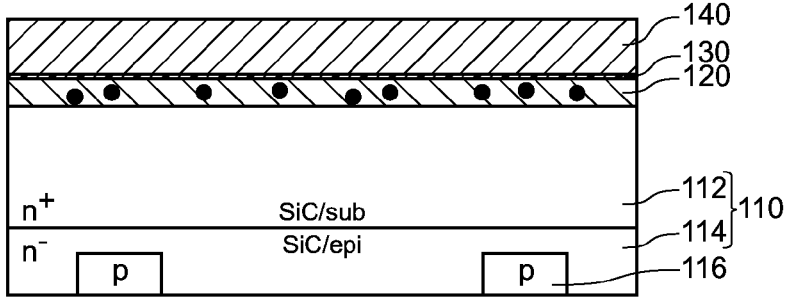
Figure 4E:
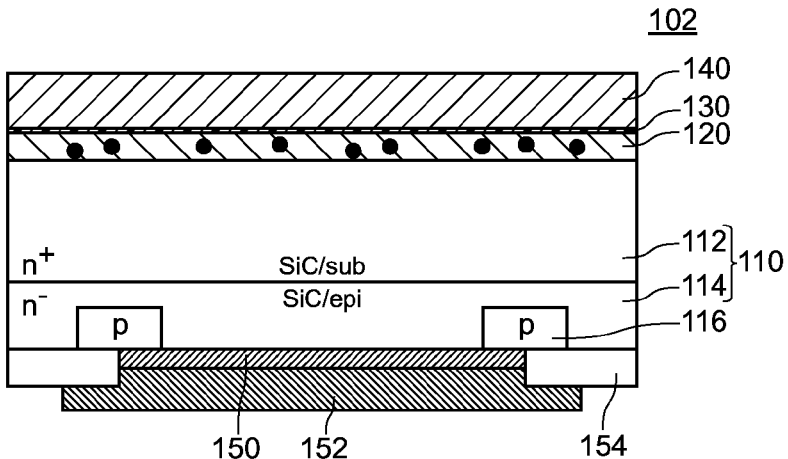

That is, in the method for manufacturing a silicon carbide semiconductor device according to the embodiment 2, as shown in FIG. 4(b) and FIG. 4(c), the oxidation layer 128 formed in the second plasma ashing step is made thin by carrying out the cleaning step so that the conductive oxidation layer 130 is exposed thus forming a surface. The cleaning step is carried out under a condition where a thickness of the conductive oxidation layer 128 after cleaning falls within a range of 0.3 nm to 2.25 nm.

In this manner, the method for manufacturing a silicon carbide semiconductor device according to the embodiment 2 differs from the method for manufacturing a silicon carbide semiconductor device according to the embodiment 1 with respect to the details of the second plasma ashing step. However, in the method for manufacturing a silicon carbide semiconductor device according to the embodiment 2, in the same manner as the silicon carbide semiconductor device and the method for manufacturing the silicon carbide semiconductor device according to the embodiment 1, the electrode layer is formed over the reaction layer with the predetermined conductive oxidation layer interposed therebetween instead of forming the electrode layer directly on the reaction layer and hence, contact resistance between the semiconductor base body (silicon carbide layer) and the electrode layer can be further reduced in the same manner as the silicon carbide semiconductor device and the method for manufacturing the silicon carbide semiconductor device according to the embodiment 1.

Further, according to the method for manufacturing a silicon carbide semiconductor device of the embodiment 2, in the same manner as the method for manufacturing the silicon carbide semiconductor device according to the embodiment 1, the etching step is carried out using a hydrochloric acid, a nitric acid and a hydrofluoric acid and hence, both components, that is, a nickel component and a silicon component can be removed by the etching step. Accordingly, it is possible to eliminate a possibility that dispersion in device characteristics occurs due to a silicon component remaining after an etching step.

Further, according to the method for manufacturing a silicon carbide semiconductor device of the embodiment 2, the silicide layer is removed by an etching process instead of a CMP process and hence, silicon carbide semiconductor devices can be manufactured with higher productivity than other conventional methods for manufacturing a silicon carbide semiconductor device.

Accordingly, the method for manufacturing a silicon carbide semiconductor device according to the embodiment 2, in the same manner as the method for manufacturing the silicon carbide semiconductor device according to the embodiment 1, can overcome a drawback that dispersion in device characteristics occurs due to a silicon component remaining after an etching step, and also can manufacture silicon carbide semiconductor devices with high productivity.

Embodiment 3

FIG. 5 is a view for explaining a method for manufacturing a silicon carbide semiconductor device according to an embodiment 3. FIG. 5(a) to FIG. 5(e) are views showing respective steps. The method for manufacturing a silicon carbide semiconductor device according to the embodiment 3 includes the steps which exactly correspond to the steps of the method for manufacturing a silicon carbide semiconductor device according to the embodiment 1 shown in FIG. 2(a) to FIG. 2(e) respectively. Accordingly, the illustration of the steps of the method for manufacturing a silicon carbide semiconductor device according to the embodiment 3 corresponding to the steps shown in FIG. 2(a) to FIG. 2(e) is omitted.

Although the method for manufacturing a silicon carbide semiconductor device according to the embodiment 3 basically includes the substantially same steps as the method for manufacturing a silicon carbide semiconductor device 100 according to the embodiment 1, the method for manufacturing a silicon carbide semiconductor device according to the embodiment 3 differs from the method for manufacturing a silicon carbide semiconductor device according to the embodiment 1 with respect to the details of the second plasma ashing step. That is, in the method for manufacturing a silicon carbide semiconductor device according to the embodiment 3, the second plasma ashing step is carried out under an ashing condition (output power 50 W, ashing time 1 min) which is further weaker than the ashing condition used in the method for manufacturing a silicon carbide semiconductor device according to the embodiment 2. Further, by adopting such a second plasma ashing step, the second etching step is omitted. After the second plasma ashing step is carried out, the silicon carbide semiconductor device is cleaned using a cleaning liquid not containing a hydrofluoric acid and, then, the electrode forming step is carried out.

Figure 5A:
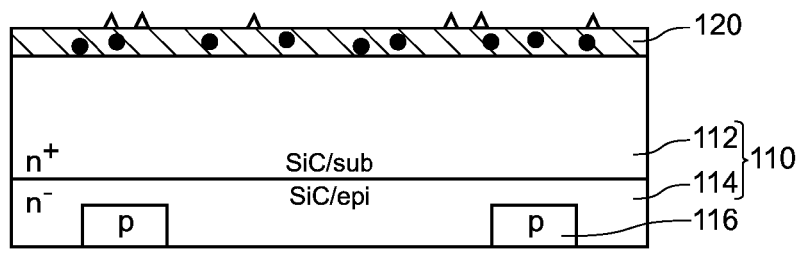
FIG. 5
A view for explaining a method for manufacturing a silicon carbide semiconductor device according to an embodiment 3.
Figure 5B:
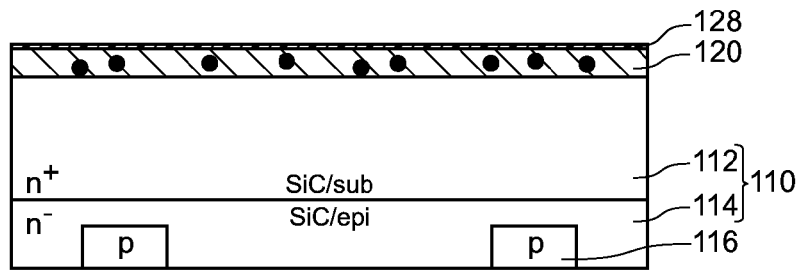
Figure 5C:
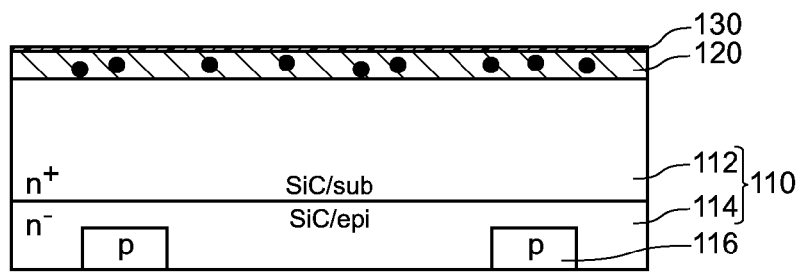
Figure 5D:
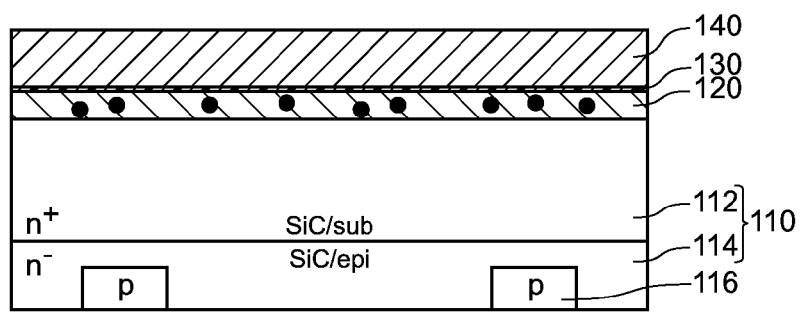
Figure 5E:
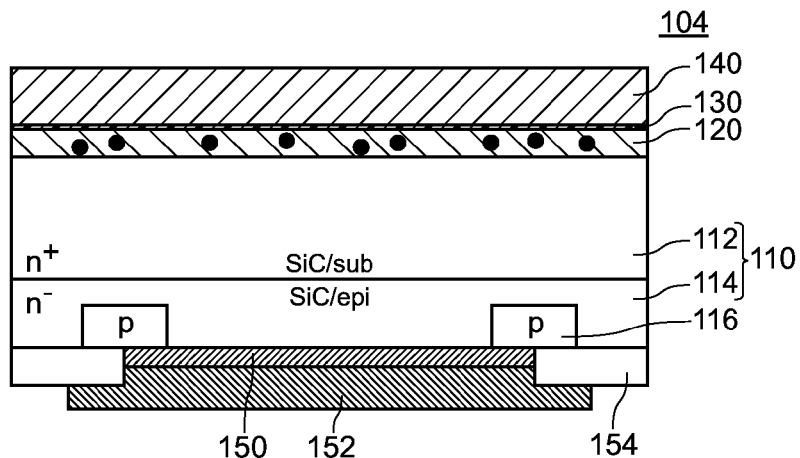
Figure 6A:
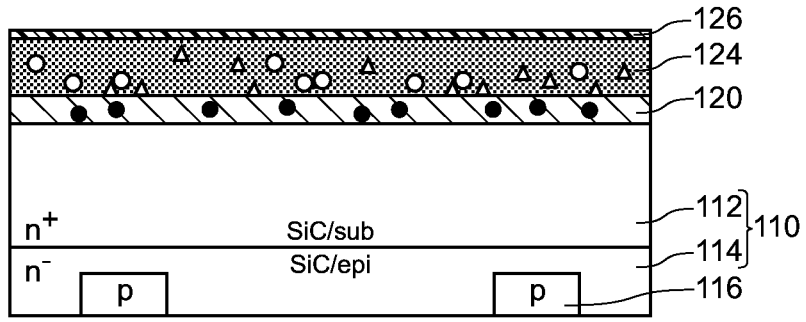
FIG. 6
A view for explaining a method for manufacturing a silicon carbide semiconductor device according to an embodiment 4.
Figure 6B:
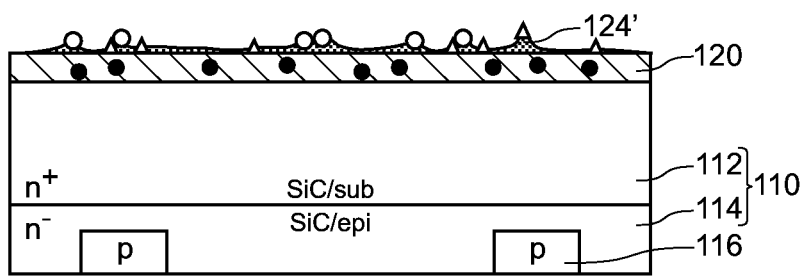
Figure 6C:
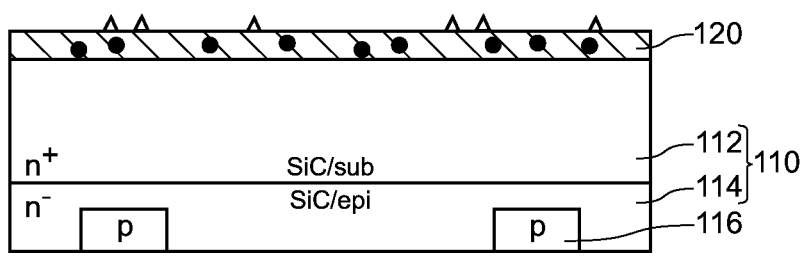
Figure 6D:
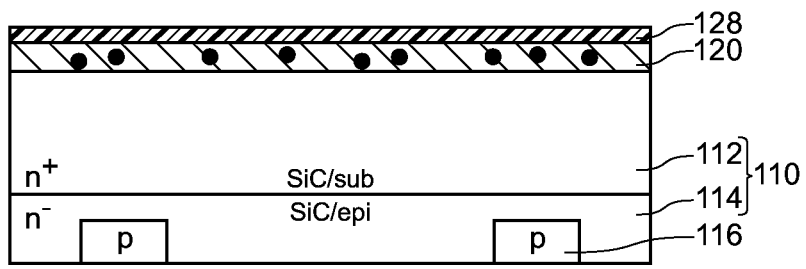

That is, in the method for manufacturing a silicon carbide semiconductor device according to the embodiment 3, as shown in FIG. 5(b) and FIG. 5(c), the oxidation layer 128 which is constituted of only the conductive oxidation layer 130 is formed by carrying out the second plasma ashing step. The second plasma ashing step is carried out under a condition where a thickness of the oxidation layer 128 (that is, the conductive oxidation layer 130) after the second plasma ashing step is carried out falls within a range of 0.3 nm to 2.25 nm.

In this manner, the method for manufacturing a silicon carbide semiconductor device according to the embodiment 3 differs from the method for manufacturing a silicon carbide semiconductor device according to the embodiment 1 with respect to the details of the second plasma ashing step. However, in the method for manufacturing a silicon carbide semiconductor device according to the embodiment 3, in the same manner as the silicon carbide semiconductor device and the method for manufacturing the silicon carbide semiconductor device according to the embodiment 1, the electrode layer is formed over the reaction layer with the predetermined conductive oxidation layer interposed therebetween instead of forming the electrode layer directly on the reaction layer and hence, contact resistance between the semiconductor base body (silicon carbide layer) and the electrode layer can be further reduced in the same manner as the silicon carbide semiconductor device and the method for manufacturing the silicon carbide semiconductor device according to the embodiment 1.

Further, according to the method for manufacturing a silicon carbide semiconductor device of the embodiment 3, in the same manner as the method for manufacturing the silicon carbide semiconductor device according to the embodiment 1, the etching step is carried out using a hydrochloric acid, a nitric acid and a hydrofluoric acid and hence, both components, that is, a nickel component and a silicon component can be removed by the etching step. Accordingly, it is possible to eliminate a possibility that dispersion in device characteristics occurs due to a silicon component remaining after an etching step.

Further, according to the method for manufacturing a silicon carbide semiconductor device of the embodiment 3, the silicide layer is removed by an etching process instead of a CMP process and hence, silicon carbide semiconductor devices can be manufactured with higher productivity than other conventional methods for manufacturing a silicon carbide semiconductor device.

Accordingly, the method for manufacturing a silicon carbide semiconductor device according to the embodiment 3, in the same manner as the method for manufacturing the silicon carbide semiconductor device according to the embodiment 1, can overcome a drawback that dispersion in device characteristics occurs due to a silicon component remaining after an etching step, and also can manufacture silicon carbide semiconductor devices with high productivity.

Embodiment 4

FIG. 6 is a view for explaining a method for manufacturing a silicon carbide semiconductor device according to an embodiment 4. FIG. 6(*a*) to FIG. 6(*d*) are views showing respective steps. The method for manufacturing a silicon carbide semiconductor device according to the embodiment 4 includes the substantially same steps as the method for manufacturing a silicon carbide semiconductor device according to the embodiment 1 except for steps corresponding to the steps of the method for manufacturing a silicon carbide semiconductor device according to the embodiment 1 which are shown in FIG. 2(*e*), FIG. 3(*a*) and FIG. 3(*b*) respectively. Accordingly, the illustration of the steps of the method for manufacturing a silicon carbide semiconductor device according to the embodiment 4 corresponding to the steps shown in FIG. 2(*a*) to FIG. 2(*d*) and FIG. 3(*c*) to FIG. 3(*e*) is omitted.

Although the method for manufacturing a silicon carbide semiconductor device according to the embodiment 4 basically includes the substantially same steps as the method for manufacturing a silicon carbide semiconductor device according to the embodiment 1, the method for manufacturing a silicon carbide semiconductor device according to the embodiment 4 differs from the method for manufacturing a silicon carbide semiconductor device according to the embodiment 1 with respect to the details of the etching step. That is, in the method for manufacturing a silicon carbide semiconductor device according to the embodiment 4, an etching step where an etchant A containing a hydrochloric acid is used and an etching step where an etchant B containing a nitric acid and a hydrofluoric acid is used are carried out in this order.

In the first etching step, using the etchant A containing a hydrochloric acid, a nickel component in a nickel oxide layer 126 which is formed by a first plasma ashing step and a nickel component in a silicide layer 124 are removed (see FIG. 6(*a*) and FIG. 6(*b*)).

In the second etching step, a silicon component in the silicide layer 124 is removed using the etchant B containing a nitric acid and a hydrofluoric acid (see FIG. 6(*b*) and FIG. 6(*c*)). As the etchant B, an etchant is used where the content ratio between the nitric acid and the hydrofluoric acid is set such that, assuming the content of the nitric acid as 100 mol, the content of the hydrofluoric acid falls within a range of 0.1 mol to 5 mol.

By carrying out the first etching step and the second etching step described above, at least a portion of a surface of a reaction layer 120 is exposed.

Thereafter, by sequentially carrying out a second plasma asking step (see FIG. 6(*d*)), a second etching step and an electrode layer forming step (see FIG. 3(*c*) and FIG. 3(*d*)), a silicon carbide semiconductor device 108 according to the embodiment 4 can be manufactured.

In this manner, although the silicon carbide semiconductor device and the method for manufacturing the silicon carbide semiconductor device according to the embodiment 4 differs from the silicon carbide semiconductor device and the method for manufacturing the silicon carbide semiconductor device according to the embodiment 1 with respect to the details of the etching step, in the same manner as the silicon carbide semiconductor device and the method for manufacturing a silicon carbide semiconductor device according to the embodiment 1, the electrode layer is formed over the reaction layer with the predetermined conductive oxidation layer interposed therebetween instead of forming the electrode layer directly on the reaction layer and hence, contact resistance between the semiconductor base body (silicon carbide layer) and the electrode layer can be further reduced in the same manner as the silicon carbide semiconductor device and the method for manufacturing the silicon carbide semiconductor device according to the embodiment 1.

Further, according to the method for manufacturing a silicon carbide semiconductor device of the embodiment 4, in the same manner as the method for manufacturing a silicon carbide semiconductor device according to the embodiment 1, the etching step is carried out using a hydrochloric acid, a nitric acid and a hydrofluoric acid and hence, both components, that is, a nickel component and a silicon component can be removed by the etching step. Accordingly, it is possible to eliminate a possibility that dispersion in device characteristics occurs due to a silicon component remaining after an etching step.

Further, according to the method for manufacturing a silicon carbide semiconductor device of the embodiment 4, the silicide layer is removed by an etching process instead of a CMP process and hence, silicon carbide semiconductor devices can be manufactured with higher productivity than other conventional methods for manufacturing a silicon carbide semiconductor device.

Accordingly, the method for manufacturing a silicon carbide semiconductor device according to the embodiment 4, in the same manner as the method for manufacturing the silicon carbide semiconductor device according to the embodiment 1, can overcome a drawback that dispersion in device characteristics occurs due to a silicon component remaining after an etching step, and also can manufacture silicon carbide semiconductor devices with high productivity.

The silicon carbide semiconductor device and the method for manufacturing the silicon carbide semiconductor device according to the embodiment 4 includes the substantially same constitution or steps as the silicon carbide semiconductor device and the method for manufacturing the silicon carbide semiconductor device according to the embodiment 1 except for the etching step. Accordingly, the silicon carbide semiconductor device and the method for manufacturing the silicon carbide semiconductor device according to the embodiment 4 can acquire advantageous effects exactly equal to the advantageous effects acquired by the substantially same constitution or steps used in common by the embodiments 1 and 4 out of the advantageous effects that the silicon carbide semiconductor device and the method for manufacturing the silicon carbide semiconductor device according to the embodiment 1 possesses.

Embodiment 5

Figure 7:
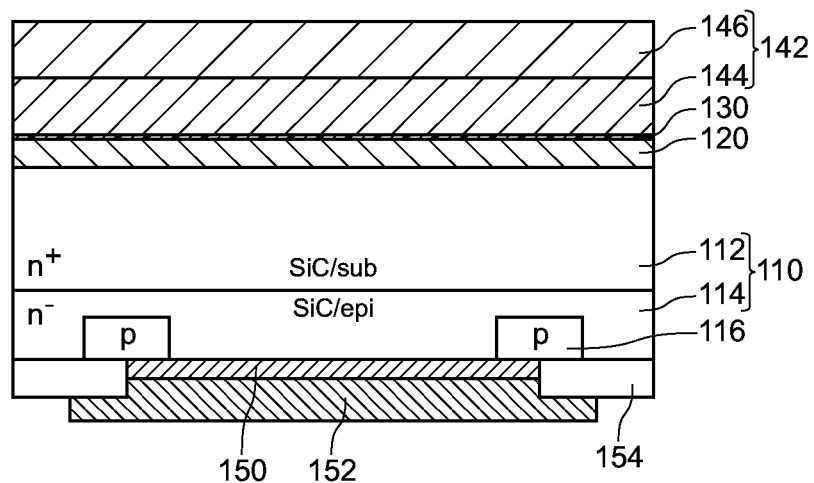
FIG. 7

FIG. 7 is a cross-sectional view of a silicon carbide semiconductor device 108 according to an embodiment 5.

Although the silicon carbide semiconductor device 108 according to the embodiment 5 has the substantially same constitution as the silicon carbide semiconductor device 100 according to the embodiment 1, the silicon carbide semiconductor device 108 according to the embodiment 5 differs from the silicon carbide semiconductor device 100 according to the embodiment 1 with respect to the constitution of a cathode electrode layer.

That is, as shown in FIG. 7, the silicon carbide semiconductor device 108 according to the embodiment 5 includes a cathode electrode layer 142 which is formed by laminating a first cathode electrode layer 144 and a second cathode electrode layer 146 to each other as the cathode electrode layer.

The first cathode electrode layer 144 is, in the same manner as the above-mentioned cathode electrode layer 140, formed by depositing metal (for example, titanium) which is a first cathode electrode material over a reaction layer 120 by vapor deposition with a conductive oxidation layer 130 interposed therebetween. A thickness of the first cathode electrode layer 144 is set to 0.5 µm, for example. The second cathode electrode layer 146 is formed by depositing metal (for example, nickel) which is a second cathode electrode material on the first cathode electrode layer 144 by vapor deposition. A thickness of the second cathode electrode layer 146 is set to 2 µm, for example.

In this manner, the silicon carbide semiconductor device 108 according to the embodiment 5 differs from the silicon carbide semiconductor device 100 according to the embodiment 1 with respect to the constitution of the cathode electrode layer. However, in the silicon carbide semiconductor device 108 according to the embodiment 5, in the same manner as the silicon carbide semiconductor device according to the embodiment 1, the electrode layer is formed over the reaction layer with the predetermined conductive oxidation layer interposed therebetween instead of forming the electrode layer directly on the reaction layer and hence, contact resistance between the semiconductor base body (silicon carbide layer) and the electrode layer can be further reduced in the same manner as the silicon carbide semiconductor device according to the embodiment 1.

According to the silicon carbide semiconductor device 108 according to the embodiment 5, an alloy layer formed of the reaction layer 120 and the silicide layer 124 is formed on a surface of a silicon carbide layer 110 and, thereafter, a surface of the reaction layer 120 is exposed, and the first cathode electrode layer (one electrode layer) 144 and the second cathode electrode layer (the other electrode layer) 146 are formed over the exposed surface of the reaction layer 120 with the conductive oxidation layer 130 interposed therebetween. Accordingly, not only the first cathode electrode layer 144 and the silicon carbide layer 110 are favorably bonded to each other with the reaction layer 120 and the conductive oxidation layer 130 interposed therebetween but also it is possible to eliminate a possibility that a carbon component in the silicon carbide layer 110 diffuses into the first cathode electrode layer 144. As a result, the concentration of carbon in the surface of the first cathode electrode layer 144 can be lowered and hence, the adhesiveness between the first cathode electrode layer 144 and the second cathode electrode layer 146 formed on the first cathode electrode layer 144 can be improved. Accordingly, there is also an advantage that it is possible to provide a highly reliable silicon carbide semiconductor device where a possibility that an electrode is peeled off is suppressed while ensuring a favorable contact between the silicon carbide layer and the electrode layer.

Example

Figure 8:
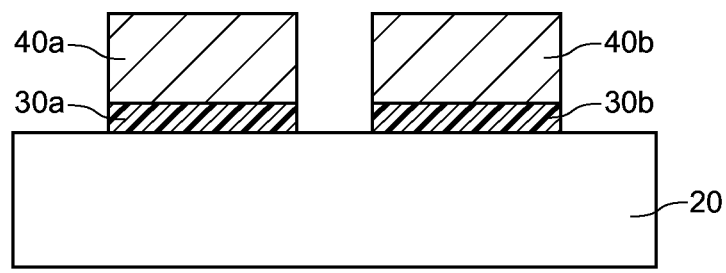
Figure 9:
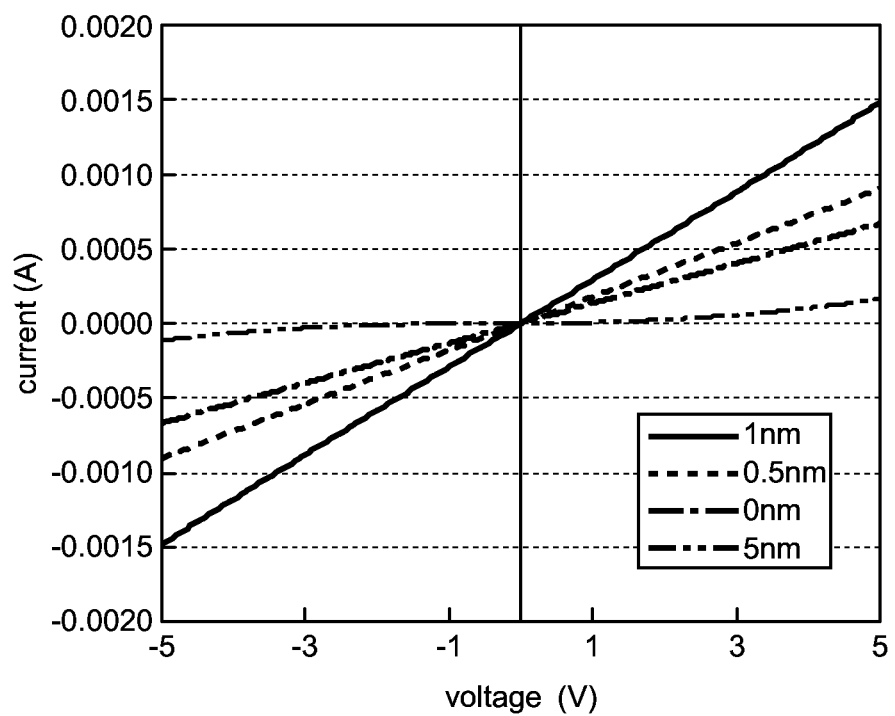
Figure 10A:
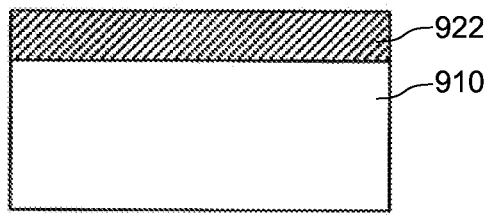
Figure 10B:
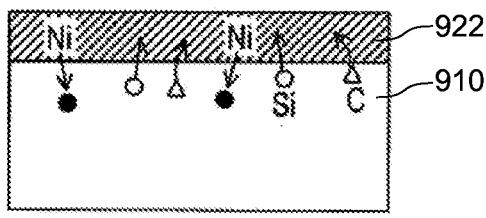
Figure 10C:
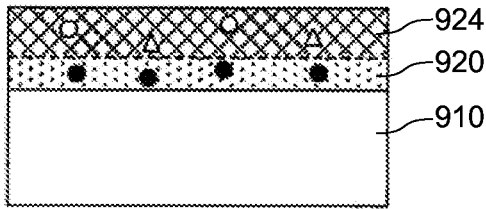
Figure 10D:
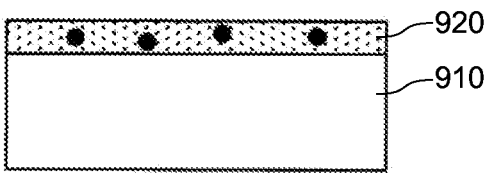
Figure 10E:
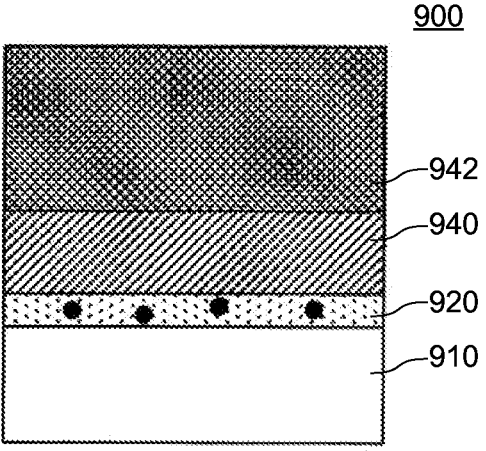

This example is provided for proving that contact resistance between a semiconductor base body and an electrode layer can be further reduced when the electrode layer is formed over a reaction layer with a conductive oxidation layer interposed therebetween. FIG. 8 is a view for explaining an evaluation system 10 used in the example, and FIG. 9 is a graph showing a result of evaluation in the example.

1. Specimens

The evaluation system 10 is, as shown in FIG. 8, prepared by forming conductive oxidation layers 30a, 30b on a surface of a silicon carbide layer (silicon carbide semiconductor base body) 20 using the same manner as the first embodiment 1, and by forming electrode layers 40a, 40b made of nickel on surfaces of the conductive oxidation layers 30a, 30b. The impurity concentration of the silicon carbide layer 20 is $1\times10^{19}$ cm$^{-3}$. An area of each electrode layer 40a, 40b is 5000 µm$^2$ (50 µm×100 µm). The respective electrode layers 40a, 40b are arranged such that longer sides (sides of 100 µm) of the respective electrode layers 40a, 40b face each other in an opposed manner. A distance between the electrode layer 40a and the electrode layer 40b is set to 3 µm. The respective electrode layers 40a, 40b are formed over the silicon carbide layer 20 by vapor deposition with the conductive oxidation layers 30a, 30b interposed therebetween.

2. Evaluation Method

A current-voltage characteristic when thicknesses of the conductive oxidation layers 30a, 30b of the evaluation system 10 are changed within a range of 0 nm to 5 nm and a voltage within a range of −5V to +5V is applied between the electrode layers 40a, 40b, is measured, and the evaluation of the specimens is performed. In this case, bulk resistance of the semiconductor base body 20 is not changed between the respective specimens and hence, a current value shown in FIG. 9 becomes large when the contact resistance between the semiconductor base body 20 and each electrode layer 40a, 40b becomes small. Accordingly, in the graph shown in FIG. 9, the greater the inclination in the rightward and upward direction, the smaller the contact resistance between the semiconductor base body 20 and each electrode layer 40a, 40b is.

3. Result of Evaluation

As can be clearly understood from FIG. 9, it is found that in the case where the conductive oxidation layers 30a, 30b having a thickness of 0.5 nm or 1.0 nm are interposed between the semiconductor base body 20 and the respective electrode layers 40a, 40b respectively, the contact resistance between the semiconductor base body 20 and each electrode layer 40a, 40b becomes small compared to the case where conductive oxidation layers are not interposed between the semiconductor base body 20 and the respective electrode layers 40a, 40b respectively. It is also found that in the case where the conductive oxidation layers 30a, 30b having a thickness of 5 nm are interposed between the semiconductor base body 20 and the respective electrode layers 40a, 40b respectively, the contact resistance between the semiconductor base body 20 and each electrode layer 40a, 40b becomes large compared to the case where conductive oxidation layers are not interposed between the semiconductor base body 20 and the respective electrode layers 40a, 40b respectively. As a result of the more detailed investigation, it is found that in the case where the conductive oxidation layers 30a, 30b having a thickness of 0.3 nm to 2.25 nm are interposed between the semiconductor base body 20 and the respective electrode layers 40a, 40b respectively, the contact resistance between the semiconductor base body 20 and each electrode layer 40a, 40b can be reduced compared to the case where conductive oxidation layers are not interposed between the semiconductor base body 20 and the respective electrode layers 40a, 40b respectively.

Although the present invention has been explained in conjunction with the above-mentioned embodiments heretofore, the present invention is not limited to the above-mentioned embodiments. The present invention can be carried out in various modifications without departing from the gist of the present invention. For example, the following modifications are conceivable.

(1) Although the etching step where an etchant A containing a hydrochloric acid is used and the etching step where an etchant B containing a nitric acid and a hydrofluoric acid is used are carried out in this order in the above-mentioned embodiment 2, the present invention is not limited to such an order. For example, the etching step where an etchant B containing a nitric acid and a hydrofluoric acid is used and the etching step where an etchant A containing a hydrochloric acid is used may be carried out in this order.

(2) The first plasma ashing step is carried out using an oxygen gas in the above-mentioned respective embodiments. However, the present invention is not limited to such embodiments. For example, the first plasma ashing step may be carried out using "a hydrogen gas" or "a mixed gas of an oxygen gas and a hydrogen gas" instead of using an oxygen gas.

(3) The second plasma ashing step is carried out using an oxygen gas in the above-mentioned respective embodiments. However, the present invention is not limited to such embodiments. For example, the second plasma ashing step may be carried out using "a mixed gas of an oxygen gas and a hydrogen gas" instead of using an oxygen gas.

(4) In the above-mentioned respective embodiments, the method for manufacturing a silicon carbide semiconductor device of the present invention has been explained by taking a Schottky diode as an example. However, the present invention is not limited to such embodiments. For example, the present invention is also applicable to a method for manufacturing a silicon carbide semiconductor device which includes a step where an electrode layer is formed over a silicon carbide layer with a reaction layer such as a power MOSFET, an IGBT, a pn diode or a thyristor interposed therebetween.

(5) In the above-mentioned respective embodiments, the present invention has been explained by taking the case where the n-type silicon carbide layer is used as an example. However, the present invention is not limited to such embodiments. The present invention is also applicable to a case where a p-type silicon carbide layer is used, for example.

REFERENCE SIGNS LIST 100, 102, 104, 106, 108, 900: silicon carbide semiconductor device, 110, 910: silicon carbide layer, 112, 912: n$^+$ type silicon carbide substrate, 114: n$^-$ type epitaxial layer, 116: guard ring, 120, 920: reaction layer, 122, 922: conductive layer, 124, 924: silicide layer, 126: nickel oxide layer, 128: oxidation layer, 130: conductive oxidation layer, 140, 142: cathode electrode layer, 144: first cathode electrode layer, 146: second cathode electrode layer, 150: barrier metal layer, 152: anode electrode layer, 154: protective insulation layer, 940: electrode layer, 942: other electrode layer

The invention claimed is:

1. A silicon carbide semiconductor device comprising:
   a silicon carbide layer;
   a reaction layer and a conductive oxidation layer which is in contact with the reaction layer, the reaction layer and the conductive oxidation layer being formed by executing the steps in the following order: a conductive layer forming step where a conductive layer is formed on the silicon carbide layer; a heat treatment step where the silicon carbide layer and the conductive layer are made to react with each other thus forming the reaction layer which is in contact with the silicon carbide layer and a silicide layer which is present on the reaction layer; a first plasma ashing step where a carbon component which the silicide layer contains is removed; an etching step where at least a portion of the silicide layer is removed using an acid thus exposing at least a portion of a surface of the reaction layer; and a second plasma ashing step where a carbon component which remains on the reaction layer is removed and a conductive oxidation layer is formed on the reaction layer, and
   an electrode layer which is formed over the reaction layer with the conductive oxidation layer interposed therebetween.

2. The silicon carbide semiconductor device according to claim 1, wherein a thickness of the conductive oxidation layer falls within a range of 0.3 nm to 2.25 nm.

3. The silicon carbide semiconductor device according to claim 1, wherein the acids are a hydrochloric acid, a nitric acid and a hydrofluoric acid.

4. A method for manufacturing a silicon carbide semiconductor device for manufacturing the silicon carbide semiconductor device; the method comprising the steps in the following order:
   a conductive layer forming step where the conductive layer is formed on a silicon carbide layer;
   a heat treatment step where the silicon carbide layer and the conductive layer are made to react with each other thus forming a reaction layer which is in contact with the silicon carbide layer and a silicide layer which is present on the reaction layer;
   a first plasma ashing step where a carbon component which the silicide layer contains is removed;
   an etching step where at least a portion of the silicide layer is removed using an acid thus exposing at least a portion of a surface of the reaction layer;
   a second plasma ashing step where a carbon component which remains on the reaction layer is removed and a conductive oxidation layer which is in contact with the reaction layer is formed on the reaction layer; and
   an electrode layer forming step where an electrode layer is formed over the exposed reaction layer with the conductive oxidation layer interposed therebetween.

5. The method for manufacturing a silicon carbide semiconductor device according to claim 4, wherein a thickness of the conductive oxidation layer falls within a range of 0.3 nm to 2.25 nm.

6. The method for manufacturing a silicon carbide semiconductor device according to claim 4, wherein
   an oxidation layer which includes the conductive oxidation layer is formed on the reaction layer in the second plasma ashing step, and
   the method further comprises a second etching step where the oxidation layer formed in the second plasma ashing step is made thin so as to expose the conductive oxidation layer between the second plasma ashing step and the electrode layer forming step.

7. The method for manufacturing a silicon carbide semiconductor device according to claim 4, wherein
   an oxidation layer which includes the conductive oxidation layer is formed on the reaction layer in the second plasma ashing step, and
   the method further comprises a cleaning step where the oxidation layer formed in the second plasma ashing step is made thin so as to expose the conductive oxidation layer between the second plasma ashing step and the electrode layer forming step.

8. The method for manufacturing a silicon carbide semiconductor device according to claim 4, wherein an oxidation layer which is constituted of only the conductive oxidation layer is formed over the reaction layer in the second plasma ashing step.

9. The method for manufacturing a silicon carbide semiconductor device according to claim 4, wherein the second plasma ashing step is carried out using any one of an oxygen gas and a mixed gas of an oxygen gas and a hydrogen gas.

10. The method for manufacturing a silicon carbide semiconductor device according to claim 4, wherein the etching step is carried out using a hydrochloric acid, a nitric acid and a hydrofluoric acid.

11. The method for manufacturing a silicon carbide semiconductor device according to claim 10, wherein the etching step is carried out using an etchant which contains a hydrochloric acid, a nitric acid and a hydrofluoric acid.

12. The method for manufacturing a silicon carbide semiconductor device according to claim 11, wherein a content ratio among the hydrochloric acid, the nitric acid and the hydrofluoric acid which the etchant contains is set such that, assuming the content of the nitric acid as 100 mol, the content of the hydrochloric acid falls within a range of 300 mol to 500 mol, and the content of the hydrofluoric acid falls within a range of 0.1 mol to 5 mol.

13. The method for manufacturing a silicon carbide semiconductor device according to claim 10, wherein
   the etching step includes an etching step where an etchant A containing a hydrochloric acid is used and an etching step where an etchant B containing a nitric acid and a hydrofluoric acid is used.

14. The method for manufacturing a silicon carbide semiconductor device according to claim 13, wherein
   the content ratio between the nitric acid and the hydrofluoric acid which the etchant B contains is set such that, assuming the content of the nitric acid as 100 mol, the content of the hydrofluoric acid falls within a range of 0.1 mol to 5 mol.

15. The method for manufacturing a silicon carbide semiconductor device according to claim 4, wherein
   the first plasma ashing step is carried out using any one of an oxygen gas, a hydrogen gas and a mixed gas of an oxygen gas and a hydrogen gas.

* * * * *